United States Patent [19]

Hicks

[11] 4,399,510

[45] * Aug. 16, 1983

[54] SYSTEM FOR MONITORING UTILITY USAGE

[75] Inventor: John R. Hicks, Irving, Tex.

[73] Assignee: Nuclear Systems, Inc., Baton Rouge, La.

[ * ] Notice: The portion of the term of this patent subsequent to Apr. 7, 1998, has been disclaimed.

[21] Appl. No.: 251,048

[22] Filed: Apr. 6, 1981

Related U.S. Application Data

[63] Continuation-in-part of Ser. No. 26,804, Apr. 3, 1979, Pat. No. 4,261,037.

[51] Int. Cl.³ .................... G06F 15/20; G01R 19/04

[52] U.S. Cl. .................... 364/464; 324/103 R; 340/870.29; 364/483; 377/19

[58] Field of Search .................... 364/464, 483; 235/92 EL; 340/870.02, 870.29; 324/113, 116, 142, 103 R; 377/19

[56] References Cited

U.S. PATENT DOCUMENTS

| | | | |
|---|---|---|---|
| 3,778,637 | 12/1973 | Arita | 364/464 |
| 3,998,093 | 12/1976 | Bertolasi | 364/483 |
| 4,080,568 | 3/1978 | Funk | 364/483 |
| 4,106,095 | 8/1978 | Yarbrough | 364/483 |
| 4,120,031 | 10/1978 | Kincheloe et al. | 364/483 |
| 4,162,530 | 7/1979 | Kusui et al. | 364/464 |
| 4,204,115 | 5/1980 | Boldridge, Jr. | 340/870.29 |
| 4,207,557 | 6/1980 | Gilkeson et al. | 340/870.02 |
| 4,261,037 | 4/1981 | Hicks | 364/464 |
| 4,327,362 | 4/1982 | Hoss | 340/870.29 |

*Primary Examiner*—Errol A. Krass

*Attorney, Agent, or Firm*—Hubbard, Thurman, Turner & Tucker

[57] ABSTRACT

Electronic circuitry monitors the electrical energy consumption of a system and displays the current cost of the energy usage. The projected monthly billing cost is calculated at the current rate of consumption, and an alarm signal and control output are generated if the projected cost is higher than a budget amount. Energy consumption is sensed optically at the electric meter and a proportional number of high frequency pulses are added to the household electrical network. These pulses are remotely sensed at any point within the household electrical network and are fed to a microprocessor for counting and conversion to cost parameters. Clock pulses are also directed to the microprocessor for calculating the billing period and for displaying time parameters. A keyboard enables initializing and modifying the cost and time parameters in the microprocessor.

21 Claims, 9 Drawing Figures

SYSTEM FOR MONITORING UTILITY USAGE

CROSS REFERENCE TO RELATED APPLICATION

This application is a continuation-in-part application of my co-pending application entitled "System for Monitoring Utility Usage" filed Apr. 3, 1979 as Ser. No. 026,804 now U.S. Pat. No. 4,261,037.

BACKGROUND OF THE INVENTION

This invention is concerned with a utility monitoring circuitry and more particularly with electronic circuitry for measuring the amount of energy consumed by a system, displaying the cost of the energy and controlling and monitoring the cost against a predetermined standard.

In the last few years, dramatic increases in the price of natural gas and oil have resulted in sharp rises in the cost of electricity for consumer use. Various incentives and programs have been pursued by state and federal governments and other institutions for the purpose of eliminating the waste of energy and developing more efficient energy sources. The consuming public, especially homeowners and industrial users of electrical energy, have become increasingly conscientious of the need for energy conservation.

In spite of the foregoing developments, it has been difficult if not impossible for a consumer of electrical energy to readily and continually monitor the amount of energy he is using. The cost of consumed energy is normally not made available to the user until a monthly statement is received, some time after the electrical energy has been consumed and the charges have been incurred. This delay can be especially damaging during periods of high power consumption or in situations where power consuming appliances or apparatus are inadvertently left running for long periods of time.

It is possible for a consumer to manually monitor his electrical energy consumption through periodic readings of his electric meter and to then calculate the charges, but this procedure is difficult and cumbersome and is therefore not practical. Moreover, present systems do not provide for feedback control to reduce, moderate or shut down the electrical power input when the maximum desired energy usage has been reached.

BRIEF SUMMARY OF THE INVENTION

In one embodiment of the present invention, a system is provided for generating and displaying to the consumer the cost of a utility such as electrical energy being used, and for controlling the amount of the utility consumed over a given period of time. The system includes an optical sensor circuit for detecting the rate of utility flow being consumed and for generating a digital pulse stream representative of the rate of utility usage. A counter circuit accumulates the pulse stream and provides a display signal representative of the current energy usage. A clock generator circuit provides a digital pulse stream representative of real time which is accumulated by a time counter circuit and also displayed by the display unit. A calculator circuit responsive to the energy usage count and the time count generates a projected sum representative of the expected utility usage over a predetermined period of time based on the current usage. A comparator circuit generates a control signal in response to the projected amount being greater than a predetermined amount. This control signal is used to provide an alarm to the user or to modify the rate of utility usage.

In a more specific embodiment of the present invention, optical electronic circuitry is provided for monitoring the amount of electrical energy consumed by a system through an electric meter during a given period of time. The rotation of the rotating disk within an electric meter is optically sensed and utilized to control a high frequency pulse generator which modulates the household electrical network. These high frequency modulation pulses are remotely sensed at any point within the household electrical system and transformed to a pulsed digital signal. A microprocessor is utilized to process the digital signals including accumulating and counting the number of pulse digital signals over a given period of time. A display unit is provided to display the pulse count in numerical form during the time period.

In yet another embodiment, the microprocessor mentioned above is utilized to count the rate of energy usage, convert the energy usage to a corresponding dollar cost, calculate the expected energy cost over a predetermined period of time, compare the projected cost to a maximum desired cost and generate a control signal if the projected cost is higher than desired.

The above invention has a number of advantages for the energy consumer. The monitoring system provides up to date information to the consumer regarding his energy usage. Data concerning cumulative energy costs are generated and continually displayed. Projected costs over a given billing period are provided to the user at any time during the billing period so that the amount of energy consumption can be modified immediately to correspond with a desired budget amount. Feedback control means can be used to automatically modify the energy consumption during the billing period.

BRIEF DESCRIPTION OF THE DRAWINGS

A more complete understanding of the invention may be had by referring to the following detailed description when taken in conjunction with the drawings wherein.

DETAILED DESCRIPTION OF THE DRAWINGS

Figure 1A:
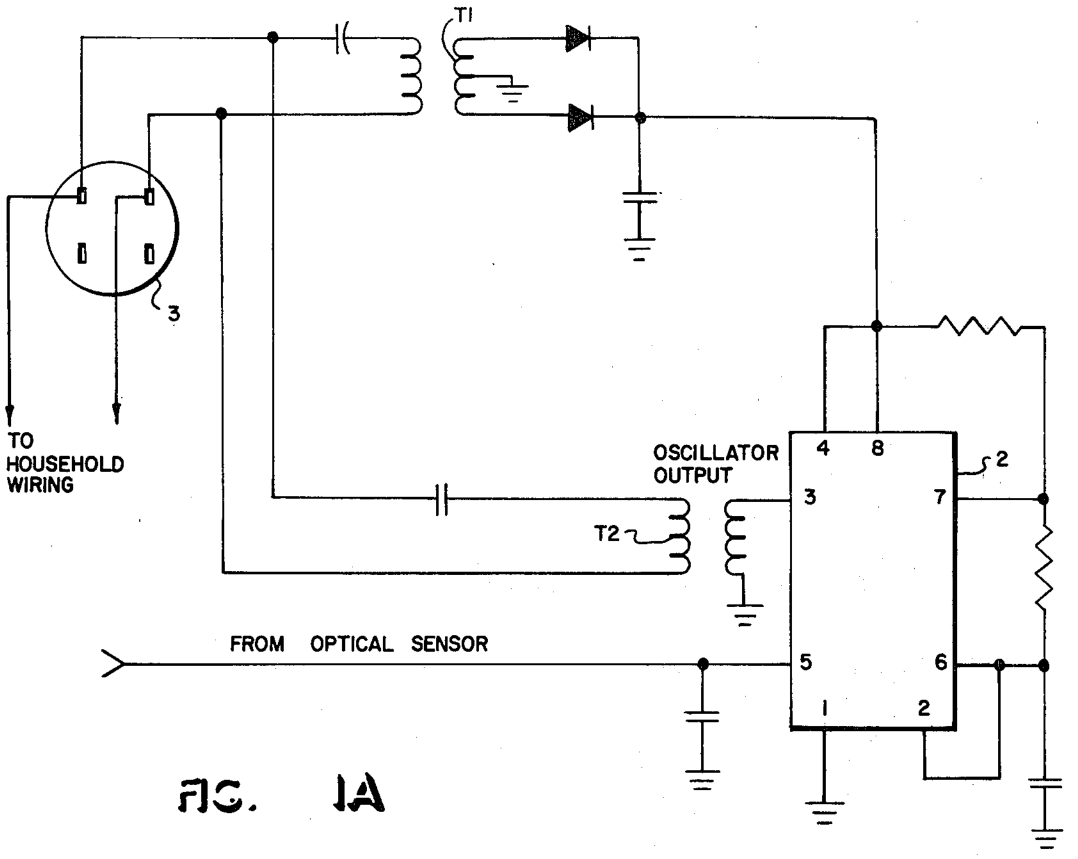
FIG. 1*a* is a schematic diagram of an electronic circuit for modulating the household electrical system with a high frequency pulse corresponding to the optically detected output of an electric meter.

Referring now to FIG. 1*a*, there is depicted a schematic diagram of the high frequency modulation circuitry of the present invention. Preferably, the supply voltage for the circuitry shown in FIG. 1*a* is provided by utilizing a power supply coupled to household electric meter 3. Thus, transformer T1 and the associated filter and rectification circuitry are effectively utilized to provide operating voltage to pins 4 and 8 or oscillator 2. Oscillator 2 is, in a preferred embodiment, an integrated circuit oscillator, such as the Signetics 555 timer.

Oscillator 2 is calibrated, utilizing resistors and a capacitor, in the manner well known in the art, to provide high frequency oscillation when enabled. Pin 5 of oscillator 2 is utilized to periodically enable oscillator 2. The control signal applied to pin 5 is generated utilizing a light detecting device (not shown) in conjunction with the rotating member of electric meter 3 (also not shown).

The output of oscillator 2 is applied to the household electrical system through transformer T2, and thus, the household electrical system may be selectively modulated with a high frequency pulse. Of course, the frequency of the generated pulse may be selected as a matter of design choice and will allow selective tuning of adjacent systems.

Figure 1B:
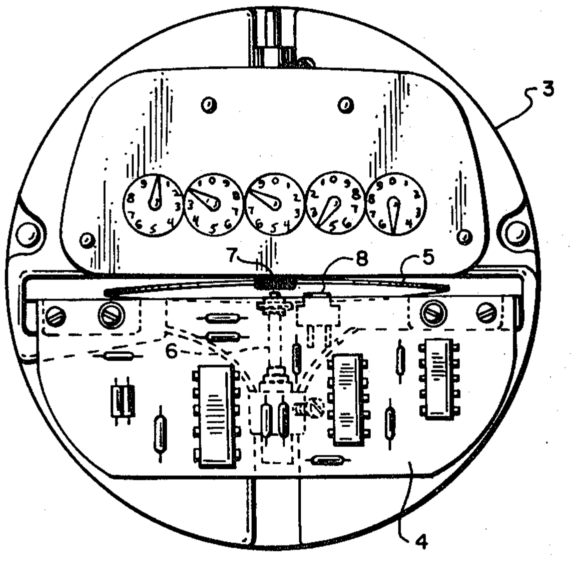
FIG. 1*b* is a diagrammatic view of the circuitry of FIG. 1*a* installed completely within a standard electric meter.

With reference now to FIG. 1*b*, there is depicted a diagrammatic view of electric meter 3, including printed circuit board 4, upon which are mounted the components depicted in FIG. 1*a*. Electric meter 3 includes a rotating disk 5 mounted on a shaft 6. At a point on the circumference of rotating disk 5 is a black section 7. Black section 7 is the calibration mark typically placed upon each rotating disk during the manufacturing process.

In addition to the components depicted in FIG. 1*a*, printed circuit board 4 also includes a light emitting-/detecting device 8. Light emitting/detecting device 8 is utilized, in one embodiment of the present invention, to detect each revolution of rotating disk 5. The light emitted by light emitting/detecting device 8 will be reflected from the surface of rotating disk 5 at all points along the circumference of rotating disk 5, except in the vicinity of black section 7. Therefore, it is a simple matter to detect each revolution of rotating disk 5 by monitoring the output of the detecting circuit of light emitting/detecting device 8. In the disclosed embodiment of the present invention, the light detecting side of light emitting/detecting device 8 is utilized to control oscillator 2 (See FIG. 1*a*) and thereby specify the time length of high frequency pulses which will modulate the household electrical system.

Figure 1C:
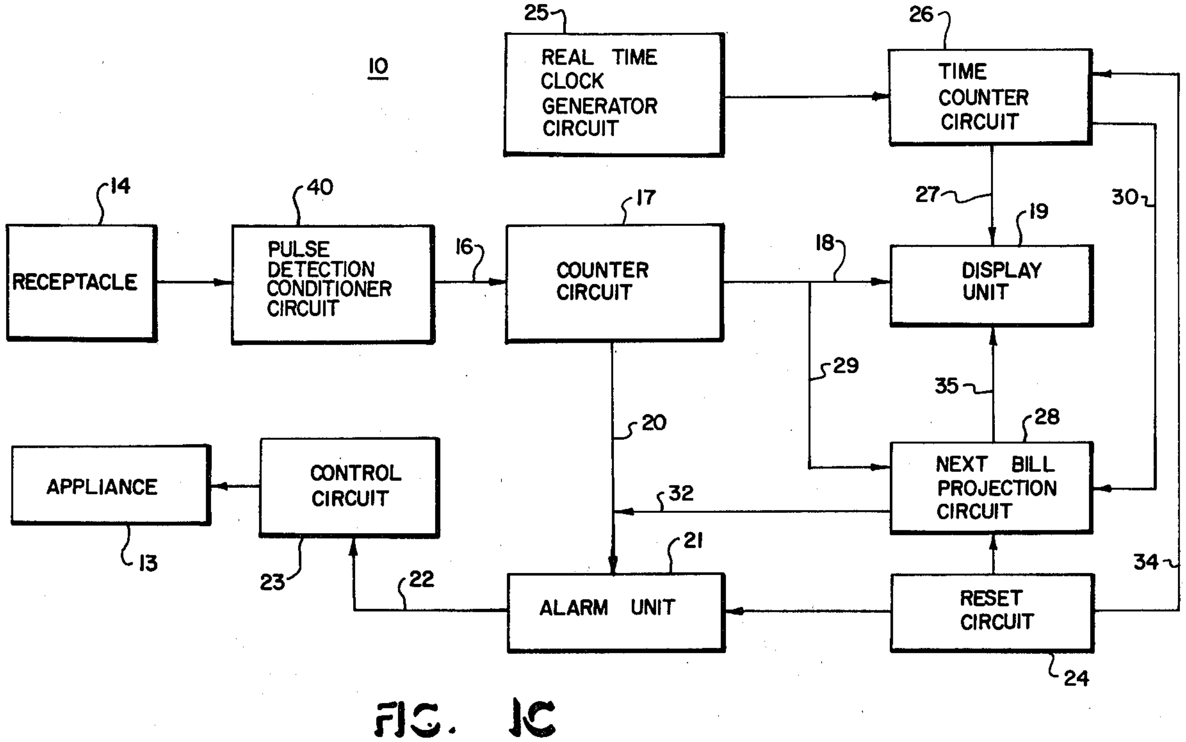
FIG. 1*c* is a block diagram of the electrical energy monitoring system embodying the present invention.

Referring now to FIG. 1*c*, a block diagram of the electrical energy monitoring system 10 of the present invention is shown. Preferably, pulse detection/conditioner circuit 40 is connected to any power receptacle 14 within the household electrical system. Counter circuit 17 counts the incoming pulses on line 16 over a given period of time and generates signals indicative of the cost of the electrical power being used. These signals are continually fed on line 18 to a display unit 19 which decodes the signals and displays them in a dollar and cents format.

The pulses are also directed on line 20 to counters within alarm unit 21. If the counted pulse signals exceed a desired amount within a predetermined period of time, an alarm signal is generated by the alarm counters to warn the user of the excessive cost being incurred. At the same time, a control signal is directed by a line 22 to a control circuit 23 which can shut down or modify incoming power to a selected appliance 13. Circuit 23 may be any type of conventional control circuit, including a simple switch unit. At the end of the desired period of time, a reset circuit 24 zeros the counters of alarm unit 21 to begin a new period. The counters of counter circuit 17 may be reset at the same time.

A real-time clock generator circuit 25 provides a clock pulse on to a time counter circuit 26, which maintains a calendar and the time of day. This time information is periodically displayed by way of line 27 on display unit 19.

A next bill projection circuit 28 receives the accumulated cost data from counter circuit 17 on line 29 and the accumulated time and calendar data from circuit 26 on line 30. This data is processed to calculate the expected power bill to be received at the end of a billing period. This projected billing amount is compared to a stored figure representing the maximum budget amount desired by the consumer. In the event that the projected billing amount exceeds the budget amount, an alarm signal is output on line 32 to alarm unit 21, initiating alarm and feedback control operations. The bill projection amount may also be displayed at the discretion of the user by display unit 19 by way of line 35. Circuit 28 also includes storage space for storing one or more of the last months' bills to be recalled and displayed by the user.

Figure 2:
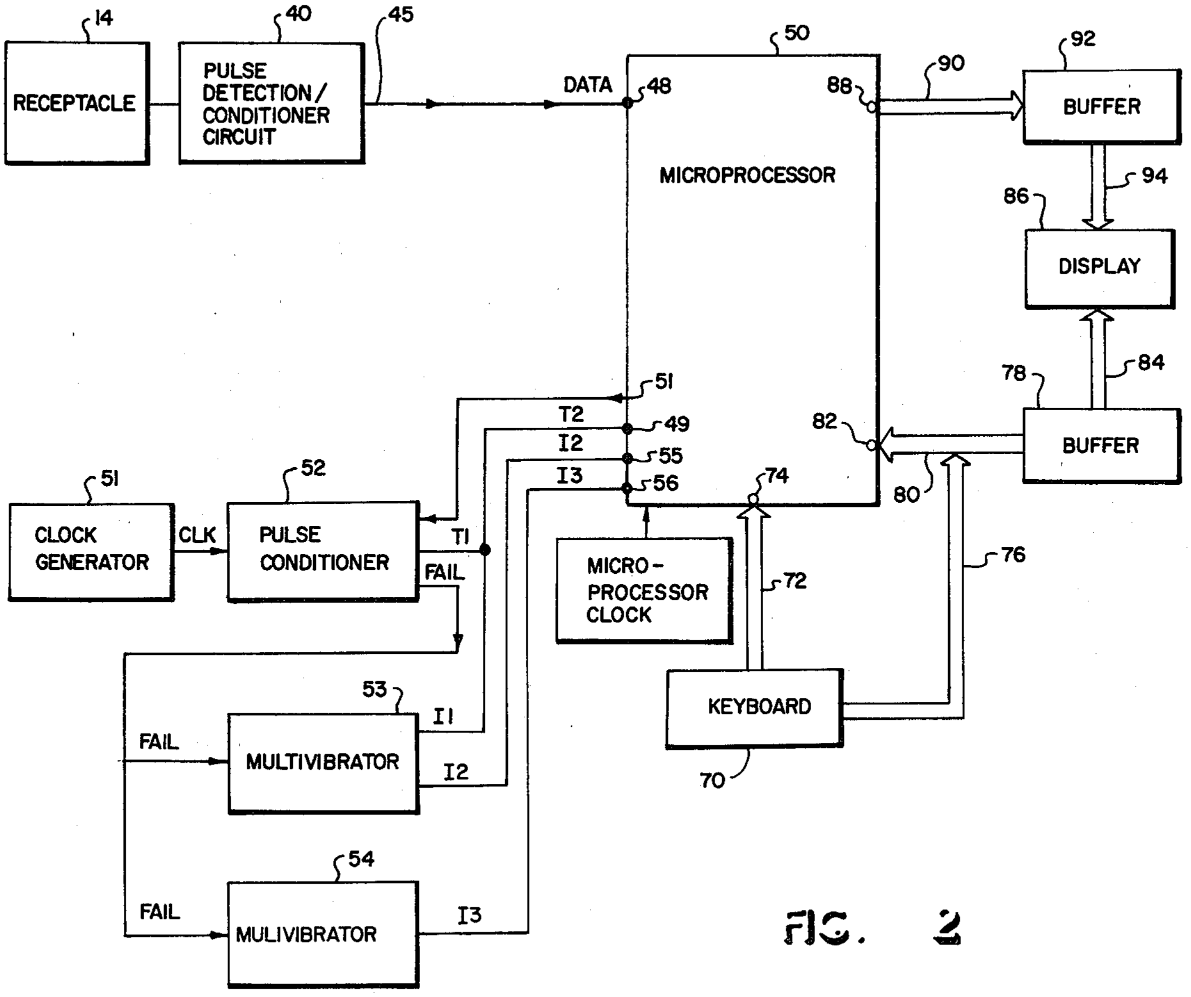
FIG. 2 is a more detailed block diagram of the invention shown in FIG. 1*c* utilizing a microprocessor.

Referring now to FIG. 2, one preferred embodiment of system 10 of the present invention is shown which utilizes a conventional microprocessor unit to perform several of the functions of the circuitry diagramed in FIG. 1C. In this embodiment, counter circuits 17 and 26, next bill projection circuit 28, reset circuit 24 and alarm unit 21 are all replaced by the microprocessor 50 of the FIG. 2 system. As shown in U.S. Pat. No. 4,147,978, signals indicative of electrical energy usage may be induced by electromagnetic sensors clamped around transformer legs in the input of a two-phase or three-phase system or such signals may be optically generated from the electric meter as depicted in the illustrated embodiment.

The high frequency pulses present on the household electrical supply are coupled out from receptacle 14 through pulse detection/conditioner circuit 40, which detects the high frequency pulses present on the household electric supply and generates a data signal. The resultant data signal is input on line 45 to the microprocessor which will be described in greater detail below.

The clock inputs to the microprocessor 50 are initiated by the clock generator 25 which comprises a clock generator 51, a pulse conditioner 52 and first and second multivibrators 53 and 54. Clock generator 51 provides a standard fullwave rectified 120 cycle per second output signal CLK. This signal is fed to pulse conditioner 52 which provides a digitally pulsed signal T1 to the interrupt input terminal 49 of microprocessor 50. Pulse conditioner 52 also receives a clock input signal from clock output terminal 51 of microprocessor 50.

In order to control the microprocessor in the event of a power failure, a FAIL signal output is directed from pulse conditioner 52 to the inputs of multivibrators 53 and 54. Multivibrator 53 provides a first output interrupt signal I1 which combines with T1 to provide a T2 time signal input at interrupt terminal 49 or microprocessor 50. A second output signal I2 from multivibrator 53 is communicated to a power-down reset input terminal 55 of microprocessor 50. Signal I1 alerts microprocessor 50 of imminent power failure so that further processing can be terminated. Multivibrator 54 provides a single output signal I3 along line 66 to a power-up reset input terminal 56 of microprocessor 50.

The control input to microprocessor 50 is provided mainly by keyboard matrix unit 70. Manual control data is provided directly along multiple line input bus 72 to input terminals 74 of microprocessor 50. Additional keyboard control and data input is fed along bus 76 and is multiplexed along bus 80 to multiple input terminals 82 of microprocessor 50. Selected data is also fed for display along bus 84 to a display unit 86. Processed data from microprocessor 50 is output from output terminals 88 along bus 90 to a buffer 92 for selective display by display unit 86 by way of bus 94.

The microprocessor unit 50 of FIG. 2 is preferably a No. 8048 unit manufactured by Intel Company of Santa Clara, Calif. This microprocessor unit is especially satisfactory for this application because it has both a programmed read-only memory with the required control functions therein and also a random access memory facilitating data storage and retrieval.

Display unit 86 is preferably a BCD-to-seven segment unit, model TIL 833 made by Texas Instruments, Dallas, Tex. Buffer 78 is preferably a power buffer multiplexer comprising a parallel bank of conventional inverter units. Similarly, buffer 92 includes a parallel bank of inverter units each being in series with a conventional buffer driver circuit providing high power output to drive the anodes of the display.

Figure 3:
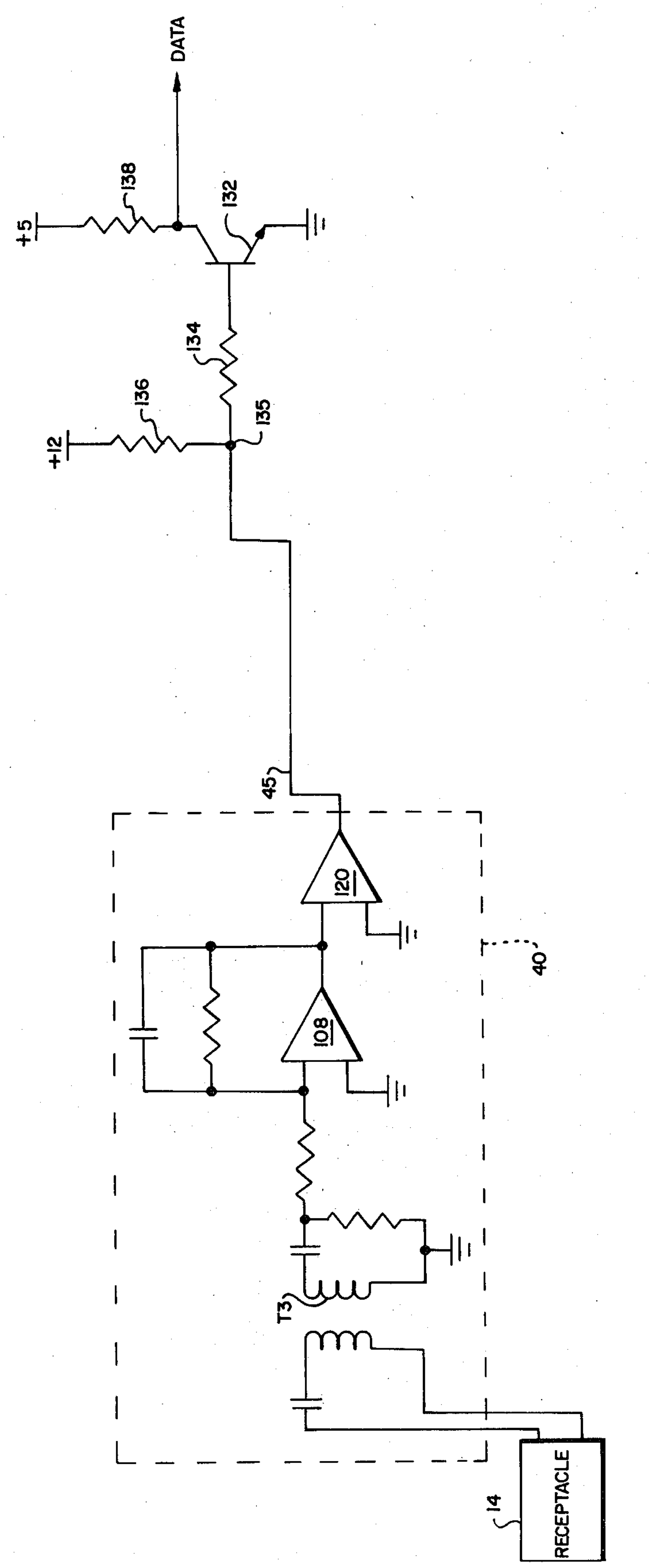
FIG. 3 is a circuit diagram of the sensing and data pulse generating units of FIG. 2.

Referring now to FIG. 3, the circuitry of pulse detection/conditioner circuit 40 is shown in greater detail. The high frequency pulses present on the household electric supply are coupled out from receptacle 14 through transformer T3. Transformer T3 includes high pass filter capacitors and effectively eliminates much of the sixty cycle component of household electricity. Operational amplifier 108 is utilized as a high pass filter and quickly saturates when a high frequency pulse is present on the household electrical supply. The output of operational amplifier 108 is applied to the input of amplifier 120. Amplifier 120 then provides a data signal, the frequency of which is proportional to the amount of energy utilization.

The data signal output from amplifier 120 is directed through a pulse conditioner circuit 131 to provide the DATA signal to the main data input terminal 48 of microprocessor 50. The pulse conditioner circuitry 131 comprises a transistor 132 having a gate input from amplifier 120 through resistor 134. The gate input is biased by a plus twelve voltage fed through a bias resistor 136. The gate output is biased by a plus five voltage through a bias resistor 138 and leads directly to the data terminal input 48 of microprocessor 50.

As an alternative to the circuitry of FIG. 3, the input sensing pulses may be provided directly by a conventional power meter having an alternative pulse initiating circuit, made for example by General Electric or Westinghouse. The output of said pulse initiating circuit may be connected directly to node 135 and would require only the pulse conditioning of circuit 131 before being directed to the microprocessor 50.

Figure 4:
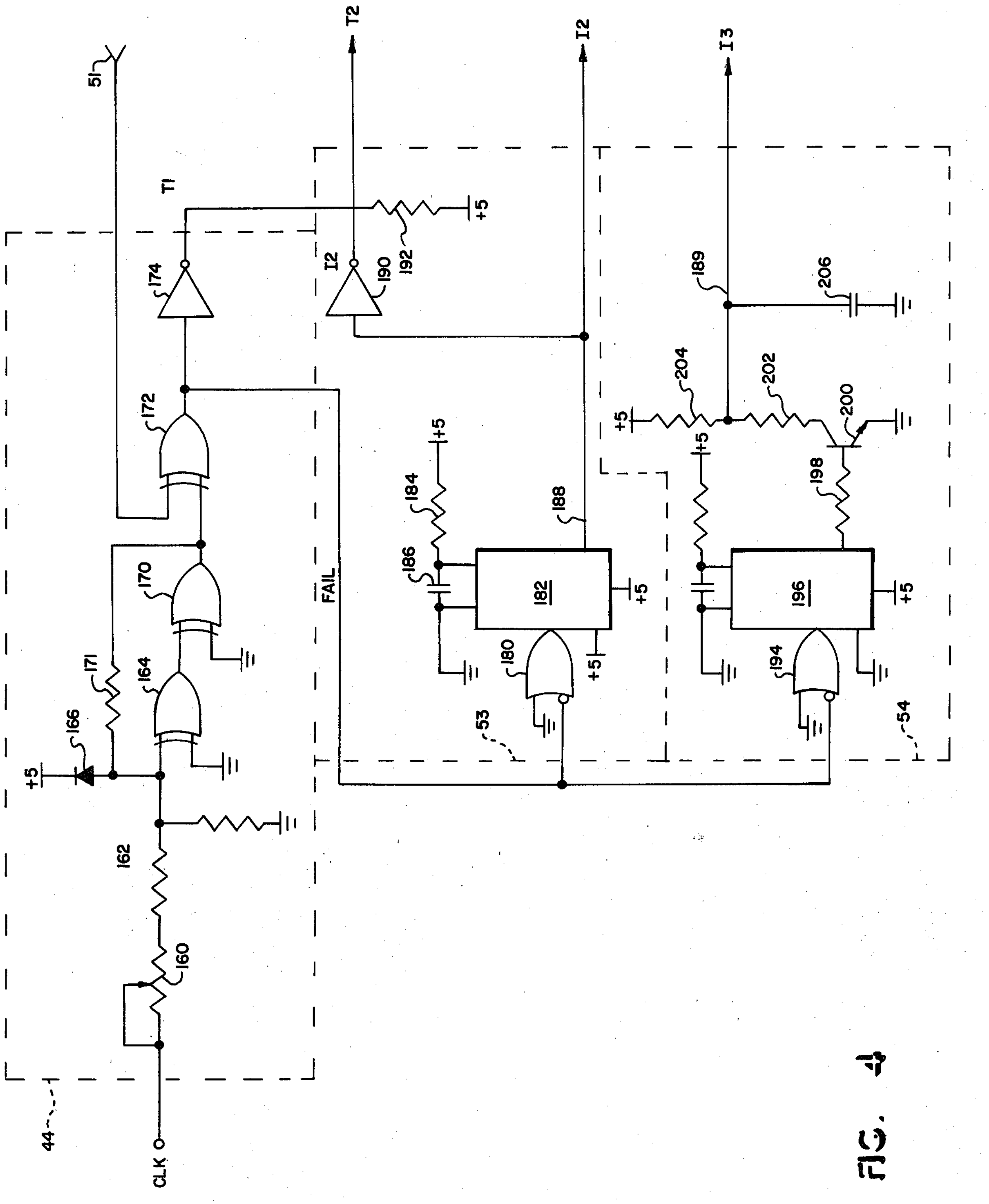
FIG. 4 is a circuit diagram of the time pulse and interrupt pulse generating circuitry of the system shown in FIG. 2.

Referring now to FIG. 4, the circuitry of pulse conditioner 52, multivibrator 53 and multivabrator 54 are shown in greater detail. The real time clock input CLK is fed through a variable resistor 160 and a fixed resistor 162 to one input of exclusive OR gate 164. The input of gate 164 is connected through a diode 166 to a plus five voltage supply. The other input of gate 164 is connected to ground. The output of gate 164 feeds to one input of another exclusive OR gate 170 having a second input connected to ground. The output of gate 170 feeds to one input of another exclusive OR gate 172, the other input being provided by the clock output terminal 51 of microprocessor 50. The output of gate 170 also feeds back through a resistor 171 to the ungrounded input of gate 164.

The output of gate 172 feeds through an inverter 174 to the interrupt input terminal 49 of microprocessor 50. The output of gate 172 also provides the FAIL signal to multivibrator units 53 and 54 to indicate a power failure.

Multivibrator unit 53 is comprised of an OR gate 180 having the FAIL signal as one input and the other input grounded. The output of OR gate 180 feeds to a flip-flop circuit 182 powered by a plus five voltage supply. The timing terminals of flip-flop 182 are connected to the plus five voltage supply through a resistor 184 and a capacitor 186. The output signal 12 of flip-flop 182 is directed along output line 188 to power-down reset input terminal 55 of microprocessor 50. Signal 12 is also directed to an inverter 190 having an output bias by a plus five voltage supply through a resistor 192. The output signal 11 of inverter 190 is connected to the interrupt input terminal 49 of microprocessor 50.

Multivibrator 54 is comprised of an OR gate 194 with the FAIL signal as one input and the other input grounded. The output of gate 194 leads to the input of a flip-flop unit 196 powered and timed in the same manner as flip-flop unit 182. The output of unit 196 is directed to the gate of a transistor 200 through a resistor 198. The collector of transistor 200 is connected through a resistor 202 to an output line 189 which is biased by a plus five voltage supply through a resistor 204. Output line 189 is isolated by a capacitor 206 and provides the 13 signal to the powerup reset input terminal 56 of microprocessor 50.

Figure 5:
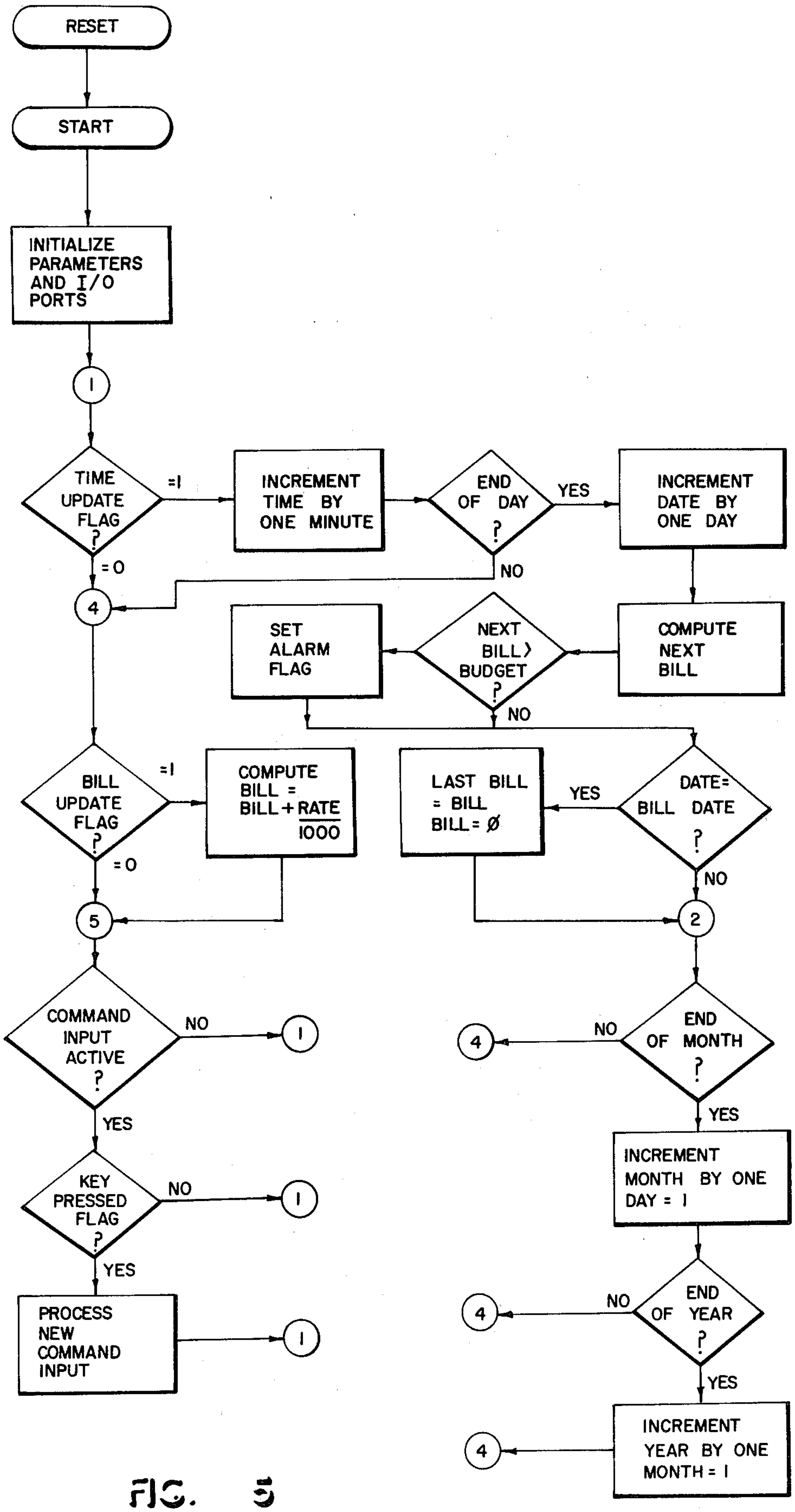
FIGS. 5, 6 and 7 are flow chart diagrams describing the operation of the system shown in FIG. 2.
Figures 6, 7:
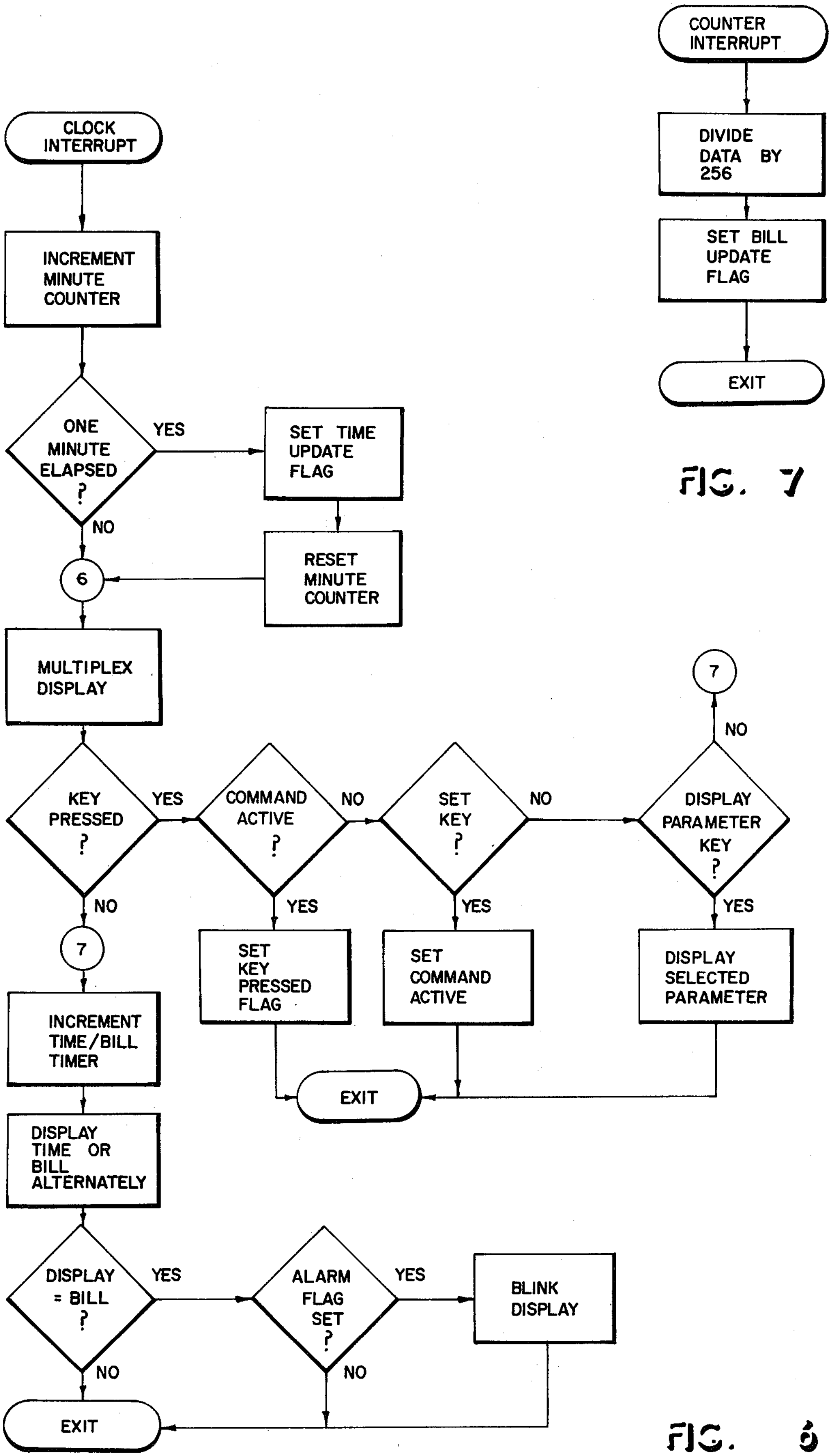

Referring now to FIGS. 5, 6 and 7, the flow charts therein describe the operation of the present system. In particular, the flow charts show the processes occurring in the microprocessor 50 to provide the desired outputs. It is understood that these operational steps could alternately be provided by hardwired circuitry with the same result as described hereinafter. The main process of the microprocessor unit is shown in FIG. 5. FIGS. 6 and 7 show interrupt processes which run simultaneously with the main program and which affect the main program, as will be described in greater detail hereinafter.

Referring to FIG. 5, the microprocessor parameters are first reset by reset signal 13 (FIG. 2) and the program is started. The parameters are initialized and the input/output ports are open. Preferably, the following parameters are manually keyed into the microprocessor memory: TIME, indicating the current time of day, DATE, indicating the current calendar day, YEAR, indicating the current year, RATE, indicating the current cost of energy, BILL DATE, that is the data on which a bill for energy usage is generated, DAYS, giving the number of days in the current month, and BUDGET, the maximum cost to be incurred for energy usage during the present billing period. A BILL parameter indicating current energy usage during the billing period begins at zero and accumulates as described hereinafter.

The next step is to perform a test to determine whether the TIME UPDATE flag is 0 and 1. If the flag is 0, the program moves on to the next set of sequences. If it is 1, the TIME parameter is incremented by one minute and is sampled to determine whether the day has ended. If not, the system moves on to the next set of sequences. If the end of the day has been reached, the DATE parameter is incremented by one day and the NEXT BILL parameter is computed. This computation is made by projecting the cost of energy usage over the remainder of the billing period (in this case one month) based on the current amount used for the current period of time elapsed. The equation used herein is as follows:

$$\text{NEXT BILL} = \frac{\text{BILL} \times \text{DAYS}}{\text{DATE} - \text{BILL DATE}}$$

A comparison is then made between the NEXT BILL parameter and the BUDGET parameter. If NEXT BILL is greater than BUDGET the ALARM flag is set. A check is then made to determine whether the DATA parameter is equal to the BILL DATE parameter. If so, it is the end of the month and the BILL parameter is stored as the LAST BILL parameter and BILL is reset to 0. If it is the end of the month, the MONTH parameter is incremented by one. A test is also made to determine whether it is the end of the year and if so the YEAR parameter is incremented as well.

The next sequence involves updating the current BILL parameter. A test is made to determine whether the BILL UPDATE flag has been set. If so, this means that one watt-hour of electricity has been used and the cost of that watt-hour is computed and added to the BILL parameter. The next step is to determine whether a COMMAND INPUT flag has been set by keyboard activity. If not, the sequence returns to the start. If so, a test is made to determine whether the KEY PRESSED flag is set and if not, the sequence is returned to start. If the key has been pressed on the keyboard, the new command input is processed into the microprocessor system. The system then returns to start and proceeds again.

Referring to FIG. 6, the clock interrupt process is shown. Preferably, the clock signal is comprised of a 120 cycle signal which is continually fed into the microprocessor. Each time a clock pulse T2 (FIG. 2) is received a MINUTE counter is incremented and a test is made to determine whether one minute has elapsed. If so, the TIME UPDATE flag is set and the MINUTE counter is reset. As previously seen in FIG. 5, the TIME UPDATE flag initiates a change in the TIME parameter which also involves a BILL parameter update if the end of the day has been reached.

Looking back at FIG. 6, the display is multiplexed to alternately display both time and current bill automatically at five second intervals. The next step is to determine whether the keyboard key has been pressed. If so, and if the COMMAND flag is active, the KEY PRESSED flag is set and the process returns to start. If the set key on the keyboard has been depressed, then the COMMAND flag is activated and the process returns to start. Finally, if the display key has been depressed on the keyboard, the DISPLAY SELECTED flag is set and the process returns to start.

If a keyboard key has not been pressed, the system moves on to the automatic display multiplexing sequence. A TIME/BILL timer is incremented each five seconds to alternate a display of the TIME parameter and the BILL parameter. If the current display is the BILL parameter and the ALARM flag has been set, then the display will blink on and off rapidly to warn the user of over extended energy usage.

Looking now at FIG. 7, a brief bill update interrupt process is shown. This sequence consists entirely of a counting operation performed to reach one kilowatt hour of energy cost. In the present system, this is achieved each 256 DATA pulses received from the power sensing circuitry as shown in FIG. 2. At the end of the pulse count, the BILL UPDATE flag is set and the route begins counting again. As can be seen from FIG. 5, if the BILL UPDATE flag is set, this means that one watt hour of electricity has been used and the bill is updated by computing that watt hour by the current rate divided by 1,000 and then by adding that amount to the current bill.

The only other interrupt routine of the present system is a manually generated interrupt when the keyboard is used. The keyboard interrupt signals are input along lines 72 and 76 which sets the KEY PRESSED flag.

Although a preferred embodiment of the present invention has been described in detail, it is understood that various changes, substitutions and alterations can be made therein without departing from the spirit and scope of the invention as defined by the appended claims.

What is claimed is:

1. Electrical circuitry for monitoring the amount of usage of electrical energy comprising:

pulse means for optically sensing each revolution of a rotating disk within an electric meter and for generating a data digital pulse signal at a frequency representative of the rate of usage of electrical energy;

clock means for generating a clock digital pulse signal representative of real time;

storage means for storing a first signal representative of a predetermined time period and a second signal representative of a predetermined amount of accumulated usage of electrical energy for said time period;

first counting means responsive to said data digital pulse signal for generating an accumulated signal representative of the current amount of accumulated electrical energy usage;

second counting means responsive to said clock digital pulse signal for generating a time signal representative of the current expired time;

calculator means responsive to said first signal, said time signal and said accumulated signal for generating a projected signal representative of the projected amount of accumulated electrical energy usage of said system for said predetermined time period; and comparator means responsive to said projected signal and said second signal for generating a control signal in response to said projected signal being greater than said second signal.

2. Electrical circuitry according to claim 1 wherein said pulse means includes a light emitting diode and a light detecting device in proximity to said rotating disk.

3. Electrical circuitry according to claim 1 wherein said storage means, first and second counting means, calculator means and comparator means comprise microprocessor means having a program storage unit, a data storage unit and an accumulator unit.

4. Electrical circuitry for monitoring the amount of cost for usage of electrical energy comprising:

pulse means for optically sensing each revolution of a rotating disk within an electric meter and for generating a data digital pulse signal at a frequency representative of the rate of usage of electrical energy;

clock means for generating a clock digital pulse signal representative of real time;

storage means for storing a first signal representative of a predetermined time period and a second signal representative of a predetermined amount of accumulated cost of electrical energy for said time period;

first counting means responsive to said data digital pulse signal for generating an accumulated signal representative of the current accumulated electrical energy usage;

second counting means responsive to said clock digital pulse signal for generating a time signal representative of the current expired time;

calculator means responsive to said first signal, said time signal and said accumulated signal for generating a projected signal representative of the projected amount of accumulated cost of electrical energy for said predetermined time period; and comparator means responsive to said projected signal and said second signal for generating a control signal in response to said projected signal being greater than said second signal.

5. The electrical circuitry according to claim 4 and further comprising display means for displaying said accumulated signal in numerical form to indicate said current cost.

6. The electrical circuitry according to claim 5 wherein said display means alternately displays the time signal and the accumulated signal in numerical form.

7. The electrical circuitry according to claim 5 wherein said display means optionally displays said projected signal in numerical form to indicate projected cost.

8. The electrical circuitry according to claim 4 and further comprising second storage means for storing a signal representative of accumulated electrical energy usage for a previous said time period.

9. Electrical circuitry for monitoring the amount of usage of electrical energy comprising:

means for optically sensing each revolution of a rotating disk within an electric meter and for generating a first pulse train representative of the rate of electrical energy usage;

means for generating a second pulse train representative of the real time rate;

microprocessor means, including means for storing a first signal representative of a predetermined time period and a second signal representative of a predetermined amount of electrical energy usage, means for counting the first and second pulse trains, means for calculating the projected electrical energy usage for said predetermined time period and means for generating a control signal in response to said projected utility usage exceeding said predetermined amount of electrical energy usage; and keyboard means for inputting said first and second signals.

10. The electrical circuitry of claim 9 and further comprising control means responsive to said control signal for modifying the amount of usage of said utility.

11. The electrical circuitry of claim 9 and further comprising alarm means for generating an alerting signal to the user in response to said control signal.

12. The electrical circuitry of claim 9 and further comprising display means for numerically displaying the accumulated electrical energy usage of said system.

13. The electrical circuitry of claim 9 wherein said calculating means comprises means for determining the cost of said projected electrical energy usage.

14. Electrical circuitry for monitoring the amount of electrical energy consumed by an electrical system, comprising:

means for optically sensing each revolution of a rotating disk within an electric meter and for generating digital pulses at a frequency representative of the rate of electrical energy usage;

first means for counting said digital pulses and for generating a sum signal representative of the cumulative amount of electrical energy used over a predetermined time period;

clock means for generating real time clock signal pulses;

second means for counting said clock signal pulses and for generating day signals and time signals representative of the calendar day and time of day;

storage means for storing a signal representative of the billing period and a signal representative of the maximum desired electrical energy usage during said billing period;

calculator means in communication with said storage means and said first and second counting means for generating signals representative of the present rate of electrical energy usage and the projected amount of electrical energy usage for said billing period;

comparator means for comparing the signal representative of the projected amount of electrical energy usage for said billing period to the signal representative of said maximum desired electrical energy usage; and means for generating an alarm signal in response to said signal representative of the projected amount of electrical energy usage being greater than said signal representative of said maximum desired electrical energy usage.

15. Electrical circuitry for monitoring the cost of electrical energy consumed by an electrical system, comprising:

means for optically sensing each revolution of a rotating disk within an electric meter and for generating digital pulses at a frequency representative of the rate of electrical energy usage;

first means for counting said digital pulses and for generating a sum signal representative of the cumulative cost of electrical energy used over a predetermined time period;

clock means for generating real time clock signal pulses;

second means for counting said clock signal pulses and for generating day signals and time signals representative of the calendar day and the time of day;

storage means for storing a signal representative of the billing period and a signal representative of the maximum desired electrical energy cost during said billing period;

calculator means in communication with said storage means and said first and second counting means for generating signals representative of the present rate of the electrical energy cost and the projected amount of electrical energy cost for said billing period;

comparator means for comparing the signal representative of the projected amount of electrical energy cost for said billing period to the signal representative of said maximum desired electrical energy cost; and means for generating an alarm signal in response to said signal representative of the projected amount of electrical energy cost being greater than said signal representative of said maximum desired electrical energy cost.

16. Electrical circuitry for monitoring the amount of usage of electrical energy, comprising:

pulse generator for optically sensing each revolution of a rotating disk within an electric meter and for providing a data digital pulse signal at a frequency representative of the rate of usage of electrical energy;

clock means for generating a clock digital pulse signal representative of real time;

first counting means responsive to said data digital pulse signal for generating a usage signal representative of the current amount of accumulated electrical energy usage;

second counting means responsive to said clock digital pulse signal for generating a time signal representative of the current expired time;

storage means for storing a time period signal representative of a predetermined time period, and for storing said usage signal and said time signal;

calculator means responsive to said time period signal, said time signal and said usage signal for generating a projected signal representative of the projected amount of accumulated electrical energy usage of said system for said predetermined time period, and display means in communication with said calculator means for displaying said projected signal.

17. The electrical circuitry of claim 16 wherein said storage means, first and second counting means and calculator means comprise a microprocessor having a program storage unit, a data storage unit and an accumulator unit.

18. Electrical circuitry for monitoring the cost of usage of electrical energy, comprising:

pulse generator for optically sensing each revolution of a rotating disk within an electric meter and for providing a data digital pulse signal at a frequency representative of the rate of usage of electrical energy;

clock means for generating a clock digital pulse signal representative of real time;

first counting means responsive to said data digital pulse signal for generating a cost representative of the current cost of accumulated electrical energy usage;

second counting means responsive to said clock digital pulse signal for generating a time signal representative of the current expired time;

storage means for storing a time period signal representative of a predetermined time period, and for storing said cost signal and said time signal;

calculator means responsive to said time period signal, said time signal and said cost signal for generating a projected signal representative of the projected amount of accumulated electrical energy cost of said system for said predetermined time period; and display means in communication with said calculator means for displaying said projected signal.

19. The electrical circuitry of claim 18 wherein said storage means, first and second counting means and calculator means comprise a microprocessor having a program storage unit and data storage unit and an accumulator unit.

20. Electrical circuitry for monitoring the amount of usage of electrical energy comprising:

first means for optically sensing each revolution of a disk within an electric meter and for generating a first pulse train representative of the rate of electrical energy usage;

second generating means for generating a second pulse train representative of the real time rate;

storage means for storing a first signal representative of a predetermined time period;

counting means responsive to the first and second pulse trains for counting the first and second pulse trains;

calculating means responsive to the storage means and the counting means for generating a projection signal representative of the projected electrical energy usage for said predetermined time period; and means for displaying said projection signal to indicate the projected amount of electrical energy during said predetermined time period.

21. Electrical circuitry for monitoring the amount of usage of electrical energy comprising:

means for optically sensing each revolution of a rotating disk within an electric meter and for generating a first pulse train representative of the rate of electrical energy usage;

means for generating a second pulse train representative of the real time rate;

microprocessor means, including means for storing a first signal representative of a predetermined time period and a second signal representative of a predetermined amount of electrical energy usage, means for counting the first and second pulse trains, means for calculating the projected electrical energy usage for said predetermined time period and means for generating a control signal in response to said projected electrical energy usage exceeding said predetermined amount of electrical energy;

keyboard means for inputting said first and second signals; and control means responsive to said control signal for modifying the amount of usage of electrical energy.

* * * * *